United States Patent [19]
Sibbald et al.

[11] Patent Number: 5,130,542
[45] Date of Patent: Jul. 14, 1992

[54] THERMAL IMAGING DEVICES

[75] Inventors: Alastair Sibbald, Maidenhead; Gek K. Chandler, Sudbury Town; Stanley Taylor, Sunbury-on-Thames, all of England

[73] Assignee: Thorn Emi plc, London, England

[21] Appl. No.: 439,972

[22] Filed: Nov. 21, 1989

[30] Foreign Application Priority Data

Nov. 26, 1988 [GB] United Kingdom ............... 8827661

[51] Int. Cl.$^5$ .................. H01L 27/146; H01L 31/101
[52] U.S. Cl. ................................. 250/338.3; 250/332
[58] Field of Search ............ 250/338.3, 338.4, 370.01, 250/370.07, 330, 332, 349

[56] References Cited

U.S. PATENT DOCUMENTS

| | | | |
|---|---|---|---|
| 4,067,104 | 1/1978 | Tracy | 29/854 |
| 4,354,109 | 10/1982 | Gelpey et al. | 250/349 |
| 4,505,844 | 3/1985 | Denisevich, Jr. | 252/500 |
| 4,889,659 | 12/1989 | Genies | 252/500 |
| 4,893,908 | 1/1990 | Wolf et al. | 350/357 |
| 4,910,149 | 3/1990 | Okube et al. | 250/370.07 |
| 4,945,240 | 7/1990 | Nix et al. | 250/330 |

OTHER PUBLICATIONS

"Patterning of Conductive Polypyrrole in Polymer Film," by M. Hikita et al., Japanese Journal of Applied Physics, vol. 24, No. 2, pp. L79–L81, Feb. 1985.

"Photoelectrochemical Polymerization of Pyrrole on TiO2 and its Application to Conducting Pattern Generation," by M. Okano et al., J. Electrochem. So., vol. 134, No. 4, pp. 837–841, Apr. 1987.

"Light-Localized Deposition of Electroconductive Polymers on n-Type Silicon by Utilizing Semiconductor Photocatalysis," by H. Yoneyama et al., J. Electrochem. Soc., vol. 135, No. 7, pp. 1699 ∝ 1702, Jul. 1988.

"Experimental Determination of the Thermal Conductivity of a Conducting Polymer: Pure and Heavily Doped Polyacetylene," by D. Moses et al., Physical Review B, vol. 30, No. 4, pp. 2090–2097, Aug. 15, 1984.

Primary Examiner—Constantine Hannaher
Assistant Examiner—Edward J. Glick
Attorney, Agent, or Firm—Fleit, Jacobson, Cohn, Price, Holman & Stern

[57] ABSTRACT

A thermal imaging device is described including an array of pyroelectric sensor elements. Each element is at least partially supported by a respective pillar of an intrinsic polymer material. The pillars provide an electrical path between the elements and a signal processing means.

9 Claims, 2 Drawing Sheets

THERMAL IMAGING DEVICES

This invention relates to thermal imagining devices and in particular to thermal imaging devices comprising an array of pyroelectric elements responsive to infrared radiation.

BACKGROUND OF THE INVENTION

The main factor limiting the performance of existing thermal imaging devices is the thermal conductance between adjacent pyroelectric elements and between each pyroelectric element and the supporting and interrogating structure.

In U.S. Pat. No. 4,354,109 there is disclosed a thermal imaging device incorporating an array of spaced apart pyroelectric elements in which each pyroelectric element is supported on a respective pillar formed from an epoxy resin containing an electrically conductive agent such as silver. Each pillar creates an electrical connection between the supported pyroelectric element and an integrated circuit effective to process electrical signals from the elements of the array, whilst also thermally insulating the element from the integrated circuit.

Such a device suffers the disadvantage however that the process for producing the pillars is relatively complicated, involving depositing a layer of the epoxy resin containing the electrically conductive agent, then ion beam milling the layer or machining the layer using optical cutting equipment or the like to create islands of the conductive epoxy material which may then be bonded to the pyroelectric elements and the integrated circuit.

The device described in U.S. Pat. No. 4,354,109 suffers the additional disadvantage that in order to achieve an adequate electrical path between the elements and the integrated circuit it is necessary to load the epoxy resin with sufficient effect of the pillars is limited. U.S. Pat. No. 4,354,109 quotes a value for the thermal conductivity of the pillars of 6 watts per centimeter degrees K., a value which would be inadequate in a practical imaging device.

SUMMARY OF THE INVENTION

It is an object of the present invention to provide a thermal imaging device wherein the above disadvantages are at least alleviated.

According to the present invention a thermal imaging device comprising an array of pyroelectric sensor elements, each element being at least partially supported by a respective pillar of an intrinsic semiconductor polymer material, the pillars providing an electrical path between the elements and a signal processing means.

The invention thus lies in the appreciation by the inventors that electrically semiconductive polymers, such as polypyrrole, polyacetylene or polythiophene which combine a suitably low thermal conductivity, typically $6 \times 10^{-3}$ W per centimeter per degree K., with a suitably high electrical conductivity, typically in excess of 1 siemens per centimeter are suitable materials for use in thermal imaging devices. As these intrinsically electrically conductive polymers may be electrochemically deposited onto an electrical contact region to form the required pillar shape without any need for further shaping, the fabrication procedure is greatly simplified compared with the fabrication of epoxy pillars as described in U.S. Pat. No. 4,354,109.

BRIEF DESCRIPTION OF THE DRAWINGS

Two thermal imaging devices in accordance with the invention will now be described, by way of example only, with reference to the accompanying drawings in which.

DESCRIPTION OF THE PREFERRED EMBODIMENTS

Figure 1:
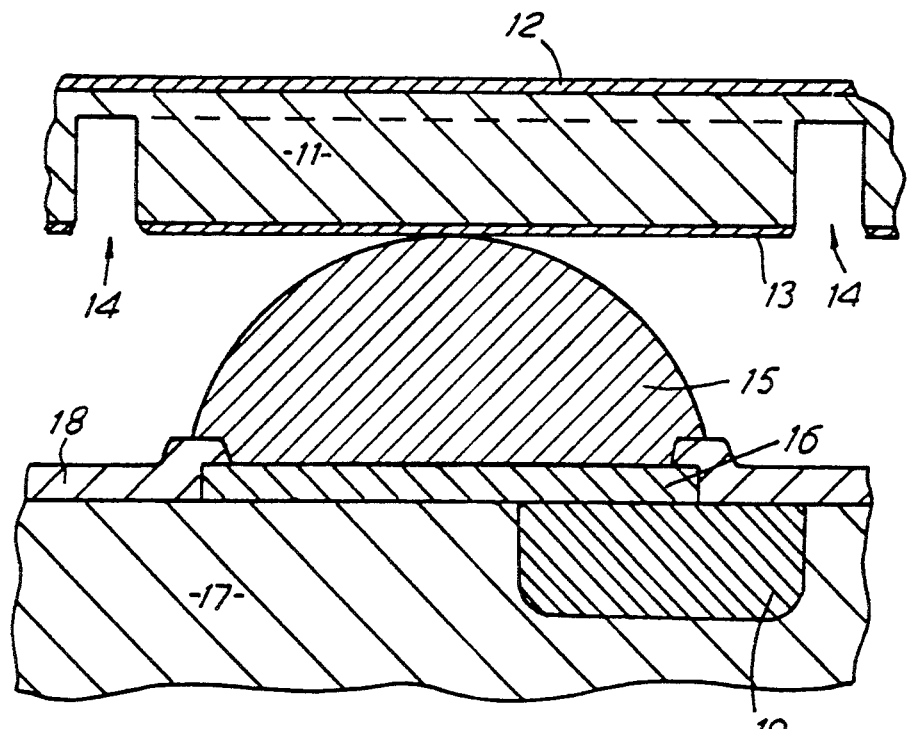
FIG. 1 is a schematic diagram of a section through part of the first device.

Referring firstly to FIG. 1, the first device to be described includes a pyroelectric plate 11 having a pattern of inter-connected electrodes 12 formed on one side and an array of discrete electrodes 13 formed on the other side. The pyroelectric plate 11 may be formed from any suitable material, for example lithium tantalate, strontium barium niobate, or triglycine sulphate. The pyroelectric sensor elements defined by the discrete electrodes 13 are separated by two orthogonal sets of parallel slots 14.

The sensor elements are supported by respective hemispherical pillars 15, the pillars being formed by the electrochemical deposition of a semiconductive polymer onto conductive input pads 16 on a silicon substrate 17. If the growth of the polymer on the pads is unrestricted, this hemispherical shape will occur naturally. The free ends of the pillars 15 are soldered onto the overlying discrete electrodes 13 to complete the electrical path between the sensor elements and the contact pads 16 to the integrated circuit.

The input pads 16 are separated laterally by insulative surface passivation layers 18, for example polyimide or silicon dioxide deposited on the silicon substrate 17. Within the substrate 17 is formed a CMOS integrated circuit indicated schematically as 29 effective to perform signal processing of the signals produced by the sensor elements in operation of the device.

It will be seen that the slots 14 between the sensor elements reduce the thermal conductance between adjacent sensor elements, which would otherwise result in cross-talk between sensor elements and loss of sensitivity. The pillars 15 create an electrical path between the sensor elements and the signal processing means, whilst providing high thermal insulation between the sensor elements and the silicon substrate 17. Suitable materials for the pillars include polyacetylene or phenyl-containing polymers.

Figure 2:
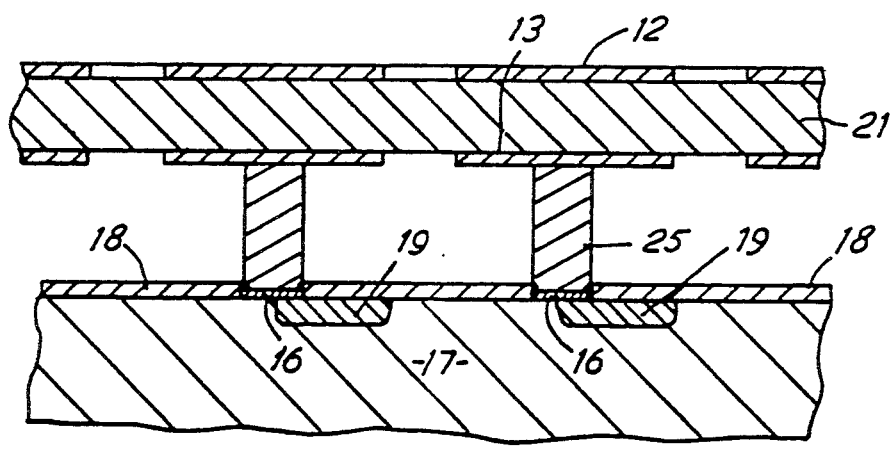
FIG. 2 is a schematic diagram of a section through part of the second device.

Referring now to FIG. 2, the second device differs from the first device in that the pyroelectric plate 11 with slots 14 is replaced by a thin pyroelectric film 21, and that the hemispherical pillars are replaced by columnar pillars 25. All other features remain unchanged and are given the same reference number as in FIG. 1. The thin film 21 in FIG. 2 has a sufficiently low transverse thermal conductance such that there is negligible cross-talk between sensor elements. If necessary however discontinuous short slits could be made between adjacent sensor elements.

Suitable materials for the pyroelectric film 21 are polyvinylidene fluoride (PVDF) or copolymers of vinylidene fluoride.

Figure 3:
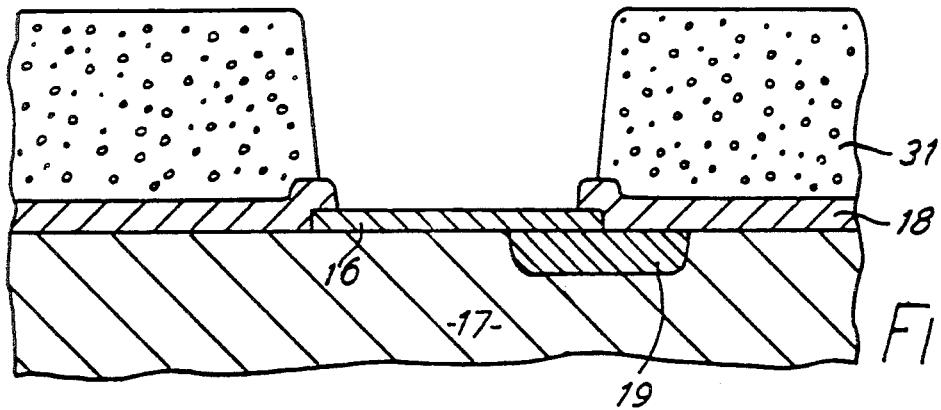
FIGS. 3, 4 and 5 illustrate three stages in the fabrication of the second device, these figures being on a different scale to that of FIG. 2 for clarity.
Figure 4:
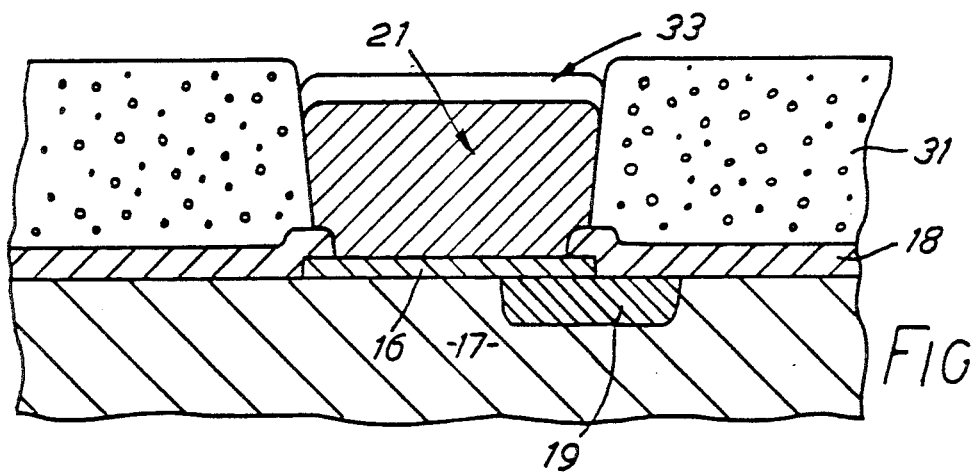
Figure 5:
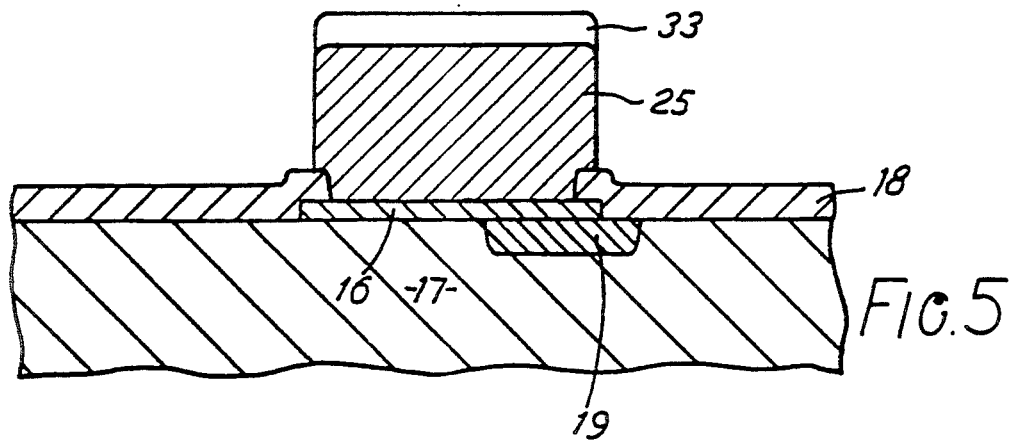

FIGS. 3, 4 and 5 illustrate one method of forming the pillars 25 shown in FIG. 2. In the method shown, a thick photoresist layer 31 provides a wall surrounding a cavity in which the pillar 25 is grown by electrochemical deposition of the semiconductive polymer. A metal layer 33 is subsequently deposited on top of the pillar 25 to facilitate soldering pillar to the respective discrete electrodes 13. The photoresist layer is then etched away to leave the columnar structure shown in FIG. 2.

It will be seen that in contrast to the device illustrated in U.S. Pat. No. 4,354,109, the pillars 25 have a diameter of only 25% of the discrete electrodes 13. This is particularly advantageous as the thermal conductance per unit area of the electrode, the so called "G" value, will then be relatively low, typically in the order of 0.1 W per square centimeter per degree K.

It will be appreciated that whilst in the devices described herebefore, the polymer pillars are fabricated by electrochemical deposition, the invention also includes devices in which the polymeric pillars are fabricated by vapour deposition, for example by the polymerization of polyacetylene. Such alternative methods will also enable the deposition of the intrinsically semiconductive polymers in the requisite shape.

We claim:

1. A thermal imaging device comprising an array of pyroelectric sensor elements, each element being at least partially supported by pillar means of an intrinsic semiconductor polymer material for providing an electrical path between the elements and a signal processing means and for minimizing thermal coupling between sensor elements.

2. A device according to claim 1 in which the polymer material is chosen from polypyrrole, polyacetylene and polythiophene.

3. A device according to claim 1 in which the pillars are substantially hemispherical.

4. A device according to claim 3 in which the pillars are formed by the unrestricted electrochemical deposition of the semiconductor polymer material.

5. A device according to claim 1 in which the pillars are columnar.

6. A device according to claim 5 in which the columnar pillars are formed using an etching process.

7. A method of forming a thermal imaging device comprising an array of pyroelectric sensor elements, the method including the step of forming a plurality of pillars of an intrinsic semiconductor material effective to at least partially supporting sensor elements, provide an electrical path between the elements and a signal processing means and minimize thermal coupling between sensor elements.

8. A device according to claim 7 in which the step of forming is an unrestricted electrochemical deposition process effective to produce hemispherical pillars.

9. A device according to claim 7 in which the step of forming includes an etching process effective to produce columnar pillars.

* * * * *